United States Patent [19]

Lee

[11] Patent Number: 5,282,158
[45] Date of Patent: Jan. 25, 1994

[54] TRANSISTOR ANTIFUSE FOR A PROGRAMMABLE ROM

[75] Inventor: Roger R. Lee, Boise, Id.

[73] Assignee: Micron Technology, Inc., Boise, Id.

[21] Appl. No.: 934,024

[22] Filed: Aug. 21, 1992

[51] Int. Cl.⁵ .................. H01L 27/02; G11C 11/34
[52] U.S. Cl. .................................... 365/96; 365/149; 257/529; 257/530
[58] Field of Search .......... 257/529, 530, 532, 288, 257/301, 377; 365/96, 102, 103, 105, 149, 225.7

[56] References Cited

U.S. PATENT DOCUMENTS

| | | | |
|---|---|---|---|
| 4,569,120 | 2/1986 | Stacey et al. | 29/574 |
| 4,569,121 | 2/1986 | Lim et al. | 29/574 |
| 4,855,247 | 8/1989 | Ma et al. | 251/412 |
| 4,943,538 | 7/1990 | Mohsen et al. | 437/52 |
| 5,100,827 | 3/1992 | Lytle | 437/52 |
| 5,119,163 | 6/1992 | Ishihara et al. | 257/530 |

Primary Examiner—Eugene R. LaRoche
Assistant Examiner—Frank Niranjan
Attorney, Agent, or Firm—Hopkins, French, Crockett, Springer & Hoopes

[57] ABSTRACT

A programmable read-only memory device and method of fabrication are disclosed having an antifuse in the drain node of a field effect transistor. Programming is accomplished by imposing a high voltage on the transistor drain and gate which causes the antifuse to be a closed circuit; otherwise, the transistor appears as an open circuit. Locating the antifuse in the drain node as opposed to the source node avoids problems of source reverse bias.

3 Claims, 4 Drawing Sheets

TRANSISTOR ANTIFUSE FOR A PROGRAMMABLE ROM

FIELD OF THE INVENTION

The invention relates in general to antifuses for a programmable read-only memory (PROM) semiconductor device and, in particular, to a PROM having an antifuse in series with the drain of a field effect transistor. A method is disclosed for fabricating these antifuses in the transistor.

BACKGROUND OF THE INVENTION

Two of the available methods to program a programmable read-only memory (PROM) include use of metallic fusible links or its opposite, the antifuse. An unprogrammed antifuse is non-conducting, and it is programmed by changing it to a conductive or low resistance state so as to close a circuit between the bit line and the array device. A fuse link, on the other hand, is conductive when unprogrammed, and it is programmed by changing it to a non-conducting state so as to open or break the circuit between the bit line and the array device. In each case, the programming is effected by imposing a high voltage on the device causing a current to flow through the link creating heat in the link. In the fuse link, heat opens the circuit; wherein, in the antifuse, the heat creates a conductor.

In the case where the memory device is a metal oxide silicon field effect transistor (MOSFET), it has typically been known to insert the antifuse in series with the source node. This has an undesirable consequence often referred to as "body effect", which occurs when there is a reverse bias on the source-substrate, $V_{SB}$. This bias can occur during programming by the high voltage due to the possibility of high resistance in the antifuse, i.e., 1,000–4,000 ohms.

The resultant voltage drop during programming through this resistance reduces the gate-to-source voltage $V_{gs}$ causing a reduced drain current, $I_D$. This reduced drain current may not be adequate to properly heat the antifuse, thereby forming a contact having high resistance.

It is, therefore, desirable to fabricate a multiplicity of small outline antifuses in a PROM MOSFET drain to avoid the reverse bias of the source and provide for a high-drain current during the programming operation.

In this PROM, the MOSFET transistor having a shorted antifuse is operational, i.e., it can be conducting, simulating a one or can be an open circuit because of the non-conducting antifuse in the drain, simulating a zero.

SUMMARY OF THE INVENTION

Briefly, the instant invention is a novel PROM chip comprising an antifuse disposed in the drain node or conductor of a field effect transistor. The novel location of the antifuse in the drain node of the FET has the benefit of increasing the voltage differential between the gate and the source of the FET without diminishing the characteristic (nominal) voltage differential between the source and the drain of the PROM. As such, the novel PROM chip of the invention has a much quicker turn-on time thereby ensuring complete burn-through of the antifuse to provide a reliable open-to-closed or zero-to-one PROM chip.

The method of forming a pair of antifuses in a pair of MOSFET devices at the drain node is as follows:

growing a gate oxide layer over a silicon substrate;
depositing a polysilicon gate layer over the gate oxide layer;
depositing a tungsten silicide layer over the polysilicon layer;
forming multiple gate areas by selectively masking and etching down to the gate oxide layer to form an antifuse region above the gate oxide layer, surrounded by a source region and a drain region;
forming a source and drain diffusion within the source and drain region by ion implantation;
forming an oxide spacer on a wall of the gate areas by oxide deposition, patterning, and etching;
patterning a second polysilicon layer over the source region;
depositing and selectively etching an ozone TEOS layer over the drain region;
patterning a trench in the drain region substrate thereby creating a first and second drain diffusion;
thermally growing an oxide within the trench;
etching away the ozone TEOS from the drain diffusions;
depositing an antifuse material over the first and second drain diffusion and within the trench;
forming a bit line contact over the antifuse material whereby the bit line is separated from the drain diffusions by a pair of thin, non-conducting antifuses.

The PROM MOSFET device consists of: a multiplicity of MOSFET transistors including a source, drain, and gate, each of the sources, drains, and gates being adapted for connection to a source node, a drain node, and a gate note, respectively; and an antifuse material deposited in a drain node of a pair of field effect transistors to provide a pair of MOSFET transistors having maximum voltage differential between the gate and the source of the FET and nominal voltage differential between the source and the drain, insuring to provide a PROM MOSFET transistor having quick turn-on time and complete burn-through of the antifuse material.

Other objects, advantages, and capabilities of the present invention will become more apparent as the description proceeds.

DETAILED DESCRIPTION OF THE INVENTION

Figure 1:
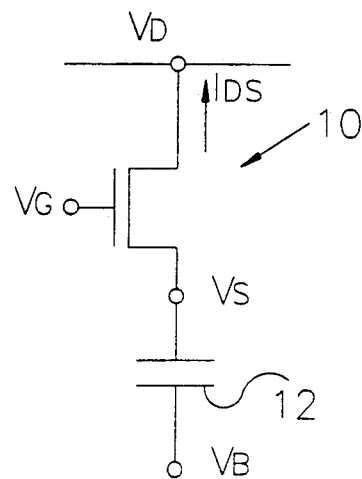
FIG. 1 is a schematic diagram of a prior art antifuse and MOSFET.

Referring to FIG. 1 (prior art), a MOSFET device 10 is illustrated having an antifuse 12 in the source side of MOSFET. As described earlier, this has the undesirable effect of creating a voltage reverse bias $V_{SB}$ thereby reducing the gate voltage $V_{gs}$ and its consequent reduction of current $I_{DS}$ at 14.

Figure 2:
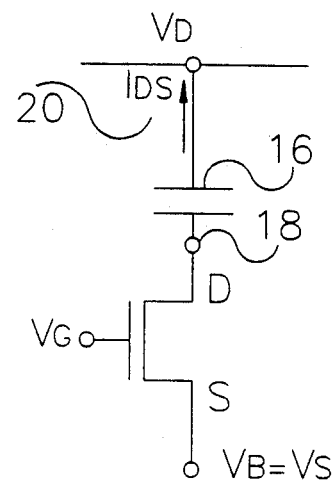
FIG. 2 is a schematic diagram of the present invention.

In FIG. 2, part of the novelty of the invention is illustrated where the antifuse 16 is adjacent drain 18, thereby not reducing gate voltage $V_{gs}$ and maximizing $I_{DS}$ drain current 20 through the antifuse so that it properly heats and becomes a good conductor after programming by high voltage on $V_{DS}$, typically 12 volts.

Figure 3:
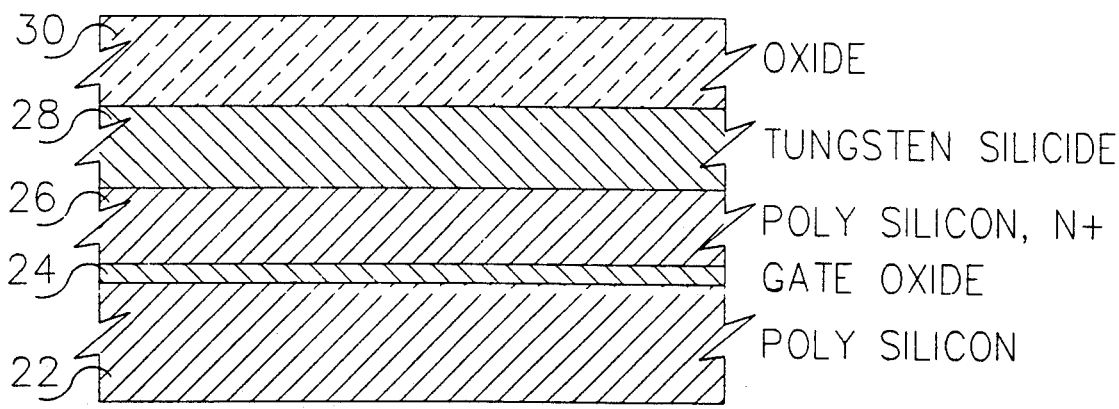
FIG. 3 is a cross-section view of the first four layers on a substrate of the present invention.
Figure 4:
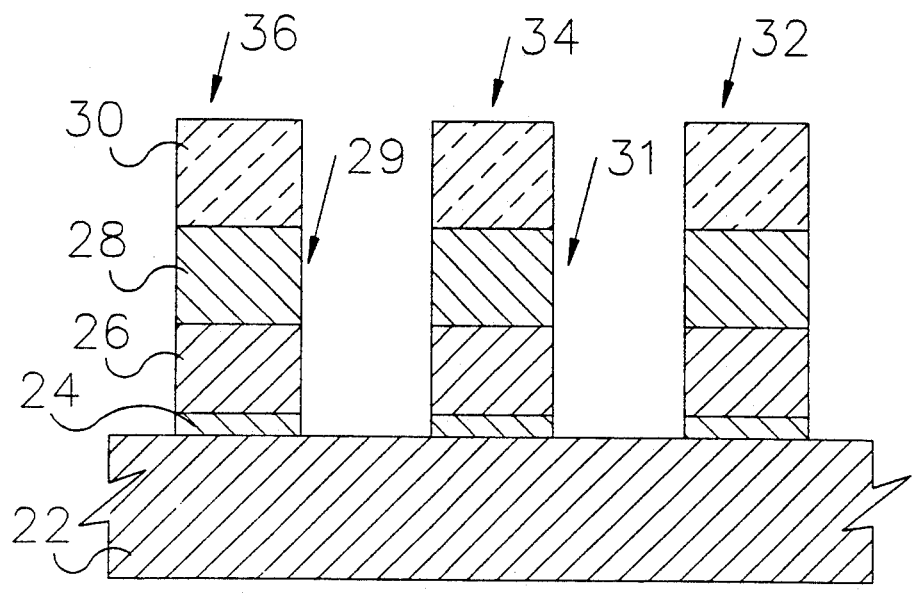
FIG. 4 is a cross-section view after patterning three layers over the substrate.
Figure 5:
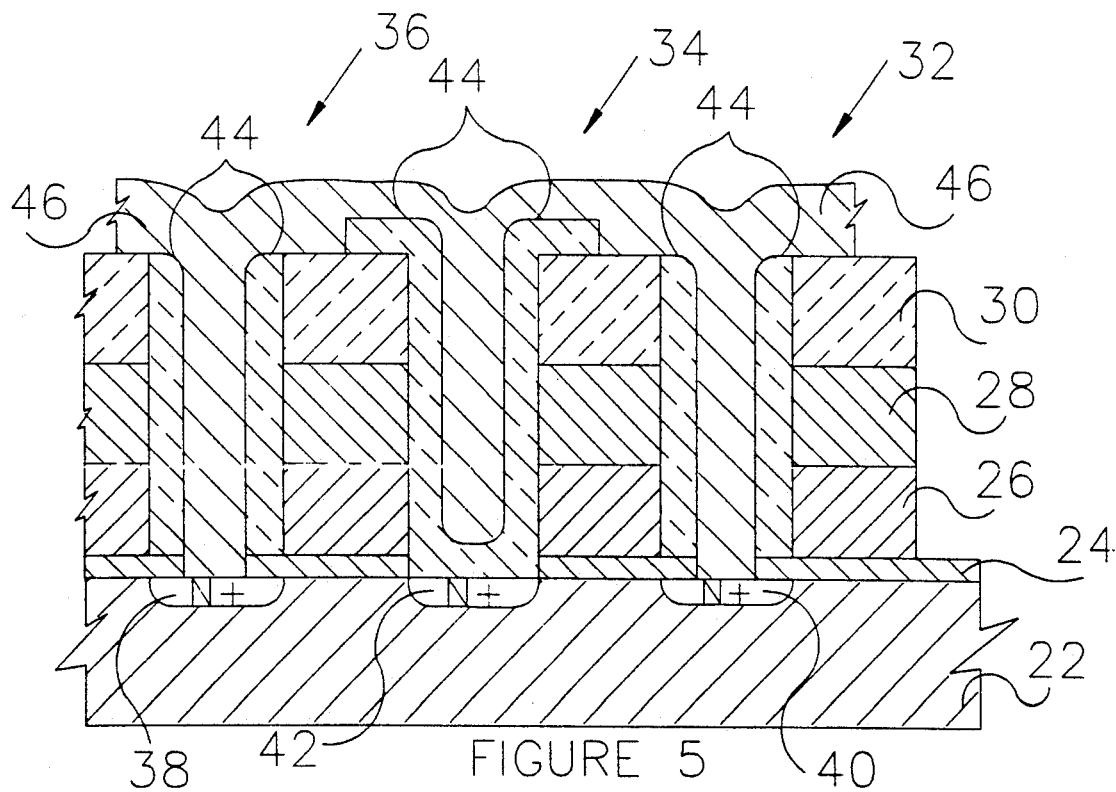
FIG. 5 is a cross-section view after adding two more layers.
Figure 6:
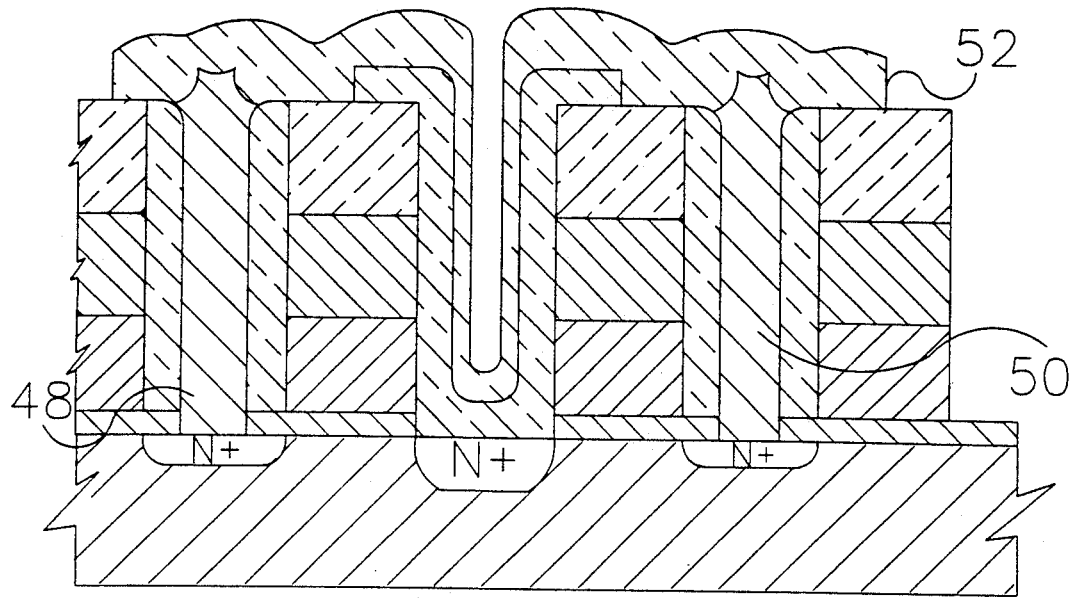
FIG. 6 is a cross-section view after patterning the two added layers.

A novel method of fabricating a pair of MOSFET devices having a common drain node will be described by referring to FIGS. 3–8. In FIG. 3, we see that three layers have been deposited on a P-well silicon substrate 22. The gate oxide 24 is thermally grown over the substrate. Above this is the gate material, doped polysilicon 26, which is deposited by a LPCVD process; and a second gate material, tungsten silicide 28, is deposited by a CVD process. These two layers form a word line as at 29. An oxide layer 30 is then deposited by CVD over the gate layers 26 and 28.

Multiple gate areas are formed at 32, 34, and 36 (FIG. 4) by selectively masking and etching down to the gate oxide 24. N+ diffusions are formed by ion implantation adjacent the gate areas creating a source diffusion 38 and 40 and drain diffusion 42. An oxide layer is deposited over the gate, source, and drain areas, and selectively patterned to form oxide spacers 44.

Figure 7:
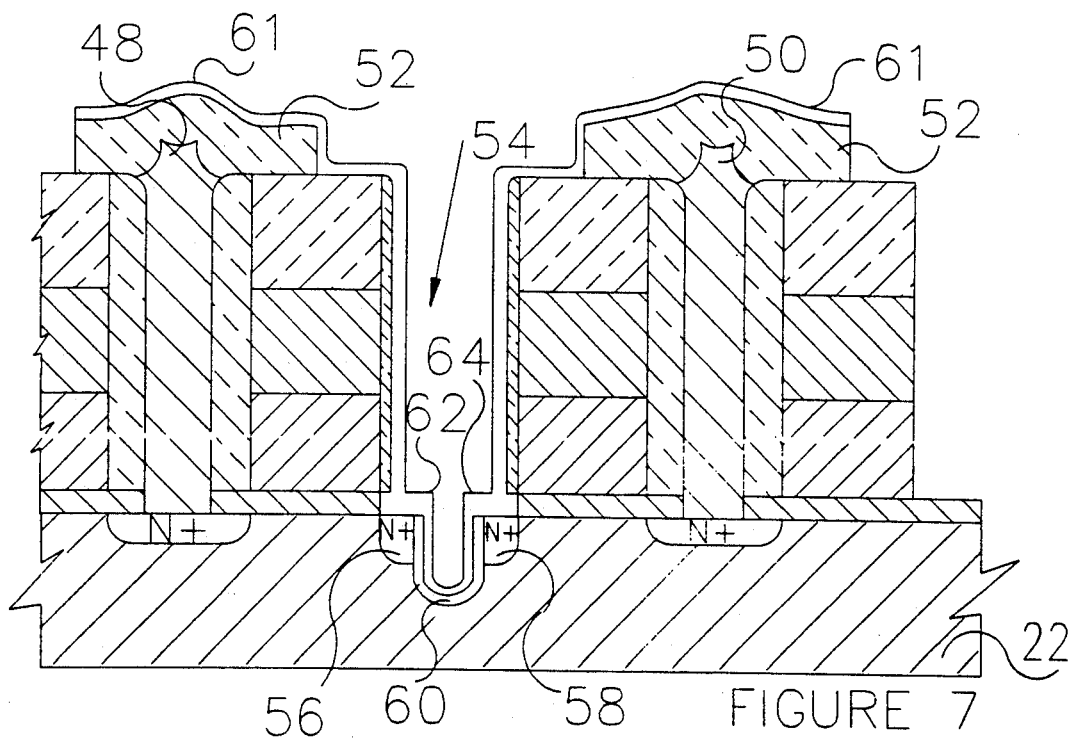
FIG. 7 is a cross-section view of the trench formed between diffusion regions.
Figure 8:
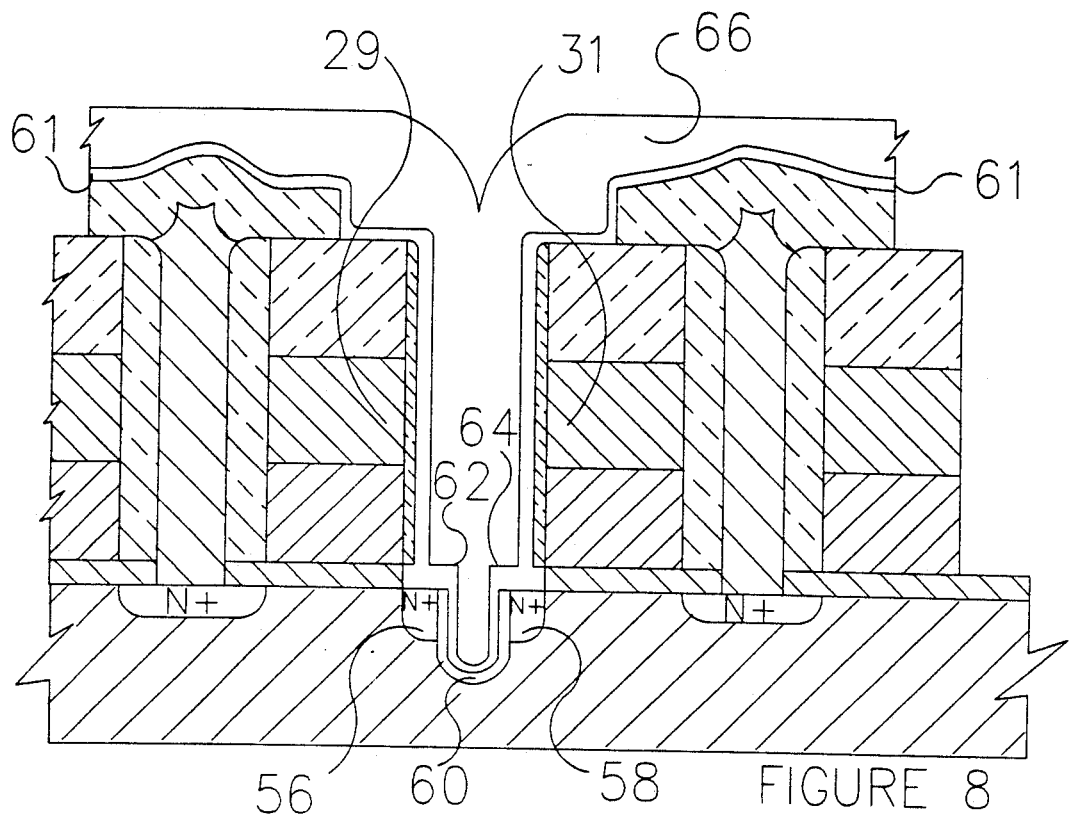
FIG. 8 is a cross-section of a pair of completed antifuses in a pair of transistors.

A source line is formed by depositing a layer of polysilicon 46 and then doping. The source lines 48 and 50 (FIG. 6) are completed by etching away all the polysilicon 46 except over the source diffusions 38 and 40. An ozone TEOS layer 52 is then deposited over the surface, and then selectively etched to cover only the source lines 48 and 50 (FIG. 7).

Trench 54 is now formed by patterning down to substrate 22 to separate the drain diffusion into a first and second drain diffusion 56 and 58. The patterning photoresist is removed and an oxide layer 60 is grown within the trench 54. Then, ozone TEOS is etched away from the drain diffusion areas 56 and 58 by HF acid.

At this point, the antifuse material, either silicon oxide or silicon nitride, is deposited conformably over the entire chip, as at 61, but has effective antifuse elements only at 62 and 64, the areas directly over the first and second diffusions 56 and 58. The next step is to form a bit line 66 (FIG. 8) over the chip making contacts at 62 and 64 above diffusions 56 and 58 and creating the two antifuses 62 and 64 between the bit line 66 and the drain diffusions 56 and 58.

Figure 9:
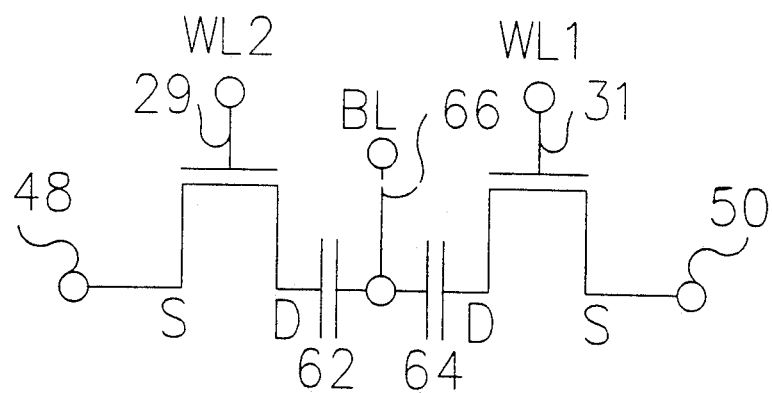
FIG. 9 is an electrical schematic of the transistors and antifuses.

Programming the device is accomplished by application or non-application of 12 volts on the bit line 66 and 12 volts on word lines 29 and 31 (FIG. 9). Voltage application "shorts" the antifuse, i.e., a closed circuit (one) and conversely no high voltage maintains an open circuit (zero). In the first case, the programming is non-erasable.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

What is claimed is:

1. A programmable read-only memory (PROM) chip having pairs of MOSFET devices comprising:
   (a) a gate oxide formed over substrate;
   (b) a pair of gates formed over the gate oxide;
   (c) a drain diffusion formed between the gates;
   (d) a pair of source diffusions formed on an outside area of the gates;
   (e) a source line formed over the pair of source diffusions;
   (f) a trench formed between the pair of gates separating the drain diffusion into a first and second drain diffusion;
   (g) an insulating oxide grown within the trench;
   (h) an antifuse material deposited over the pair of MOSFET devices and having electrical contact with the first and second diffusions; and
   (i) a bit line deposited over the trench and drain diffusions, wherein applying a voltage on the bit line and source line shorts the antifuse material thereby creating a functional MOSFET, and not applying a voltage on the bit line and source line provides an open circuit.

2. The PROM chip of claim 1 wherein the gates further comprise:
   (a) a doped polysilicon layer over the gate oxide;
   (b) a tungsten silicide layer over the doped polysilicon layer; and
   (c) an oxide layer over the tungsten silicide layer.

3. The PROM chip of claim 2 wherein the antifuse material is selected from the group consisting of silicon oxide and silicon nitride.

* * * * *